United States Patent [19]

Broder

[11] 3,912,540

[45] Oct. 14, 1975

[54] COVERED SILICON SOLAR CELLS AND METHOD OF MANUFACTURE

[75] Inventor: Jacob D. Broder, Cleveland Heights, Ohio

[73] Assignee: The United States of America as represented by the United States National Aeronautics and Space Administration Office of General Counsel-Code GP, Washington, D.C.

[22] Filed: June 18, 1973

[21] Appl. No.: 371,322

Related U.S. Application Data

[63] Continuation-in-part of Ser. No. 154,930, June 21, 1971, abandoned.

[52] U.S. Cl. ...................................... 136/89; 29/572

[51] Int. Cl.$^2$ .................. H01L 31/04; H01L 21/312

[58] Field of Search .......... 154/930; 136/89; 29/572

[56] References Cited

UNITED STATES PATENTS

| | | | |
|---|---|---|---|
| 2,946,763 | 7/1960 | Bro et al. | 260/87.5 A |
| 2,954,349 | 9/1960 | Jenness, Jr. | 350/1 X |
| 3,062,793 | 11/1962 | Eleuterio | 260/87.5 A |
| 3,121,648 | 2/1964 | Jensen | 136/89 |
| 3,411,050 | 11/1968 | Middleton et al. | 136/89 X |
| 3,539,883 | 11/1970 | Harrison | 136/89 X |

*Primary Examiner*—A. B. Curtis
*Attorney, Agent, or Firm*—N. T. Musial; G. E. Shook; John R. Manning

[57] ABSTRACT

An improved silicon solar cell has a transparent plastic film of fluorinated ethylene propylene copolymer for a binding agent to attach a cover glass.

5 Claims, 2 Drawing Figures

COVERED SILICON SOLAR CELLS AND METHOD OF MANUFACTURE

RELATED APPLICATION

This application is a continuation-in-part of application Serial No. 154,930 which was filed June 21, 1971 and is now abandoned.

ORIGIN OF THE INVENTION

The invention described herein was made by an employee of the United States Government and may be manufactured and used by or for the Government for governmental purposes without the payment of any royalties thereon therefor.

BACKGROUND OF THE INVENTION

This invention is concerned with binding cover glasses to silicon solar cells. The invention is particularly directed to the use of a plastic film as a binding agent between the cover glass and the solar cell.

Silicon solar cells used in space applications are covered with quartz or other transparent glasses. These cover glasses aid in the dissipation of heat from the illuminated cell and minimize damage from bombarding particles. Epoxy cements have been used to attach the cover glasses to the solar cells. These cements are sensitive to ultraviolet radiation and tend to degenerate under short wave-length radiation.

Ultraviolet filters are used to prevent this type of degradation. Such a filter reduces the blue light impinging on the active cell surface which, in turn, reduces the efficiency of operation of the cell. This reduction becomes more serious as the cell is bombarded by electrons and protons in outer space.

SUMMARY OF THE INVENTION

These problems have been solved by utilizing a thin film of plastic material as a binding material. A copolymer of fluorinated ethylene propylene has been used successfully for this purpose.

OBJECTS OF THE INVENTION

It is, therefore, an object of the present invention to provide an improved covered silicon solar cell.

Another object of the invention is to provide a covered solar cell having a binding material whose short circuit current response is substantially unaffected by ultraviolet radiation exposure.

A further object of the invention is to provide a covered solar cell having a binding material that does not degrade in its bonding characteristics under particular radiation bombardment.

These and other objects of the invention will be apparent from the specification which follows and from the drawing wherein like numerals are used throughout to identify like parts.

DESCRIPTION OF THE PREFERRED EMBODIMENTS

Figure 1:
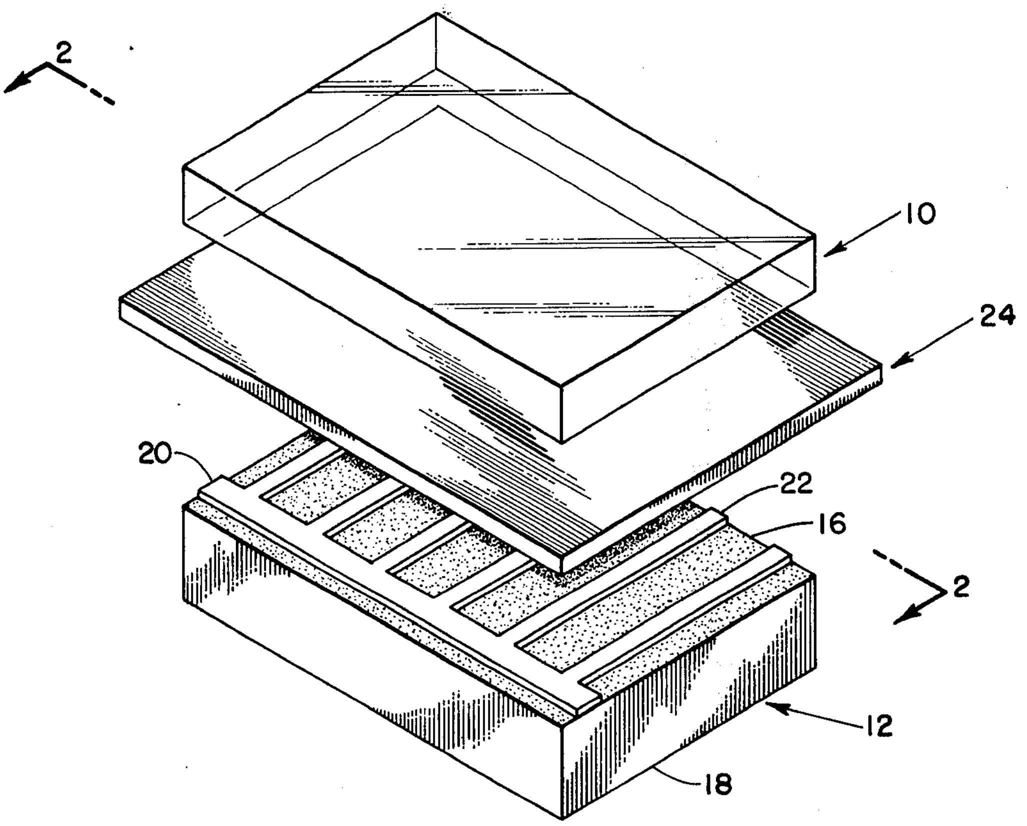
FIG. 1 is a perspective view of a solar cell assembly prior to attaching a cover glass.
Figure 2:
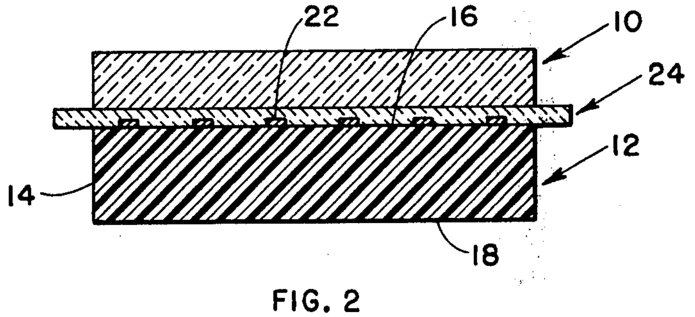
FIG. 2 is a vertical section view of the assembly shown in FIG. 1 taken along the line 2—2 showing a solar cell covered in accordance with the present invention.

Referring now to the drawings a cover glass 10 and solar cell 12 are assembled in the manner shown in FIG. 1. This assembly is then bonded together in accordance with the invention to form a covered solar cell as shown in FIG. 2.

The solar cell 12 is formed from a wafer 14 of silicon material into which a junction has been diffused. Electrical contact is made to both the top surface 16 which is covered with an anti-reflection coating and the bottom surface 18. A main contact 20 and grid fingers 22 are formed on the top surface 16.

According to the present invention a thin film 24 of a transparent plastic material is placed between the cover glass 10 and the solar cell 12 prior to covering as shown in FIG. 1. The film 24 preferably has a thickness between one and two mils. A fluorinated ethylene propylene copolymer described in U.S. Pat. No. 2,946,763 and known commercially as Teflon FEP has been a successful transparent material for this purpose.

It has been found that Teflon FEP does not reduce the short circuit current response of the solar cell more than 3 percent after 5000 equivalent solar hours of ultraviolet radiation exposure in accordance with the procedure set forth in NASA TMX 1905 dated October 1969 . Also Teflon FEP does not degrade in its bonding characteristics under bombardment doses up to about 15 megarads of particulate radiation, such as electrons and protons.

Type C FEP Teflon has been a satisfactory binding agent. Type A Teflon FEP which is described in U.S. Pat. Nos. 3,265,092 and 3,500,870 has also been successful when used with an adhesive primer or coupling agent, such as silane.

Heat and pressure are applied to the assembly shown in FIG. 1 to bond the cover glass 10 to the solar cell 12. By way of example a satisfactorily covered solar cell has been made by heating the assembly to approximately 550°F and applying a pressure of about 15 psi for about 5 minutes. Any excess plastic material is then trimmed from the completely assembly.

There is no loss in total response of such a cell to AMO light. A $1 \times 2$ centimeter cell before application of the cover glass and FEP Teflon binder had a response of 67.43 ma outer space short circuit current. After application of the cover glass and Teflon binder the cell had a total response of 67.47 ma. This compared with a typical epoxied glass cell combination response of 63–64 ma for $1+2$ cm cell.

DESCRIPTION OF THE ALTERNATE EMBODIMENT

While the preferred embodiment has been shown and described various structural modifications and alterations may be made without departing from the spirit of the invention and the scope of the subjoined claims. By way of example, it is contemplated that the FEP Teflon could be first bonded to the cover glass and then the glass-Teflon assembly could be bonded to the cell.

What is claimed is:

1. A covered solar cell for use in space consisting essentially of a wafer of silicon semiconductor material, an electrical contact on the surface of said wafer, an antireflective coating on said surface of said wafer and said electrical contact, a transparent cover glass covering said surface of said wafer and electrical contact to dissipate heat and minimize bombardment damage, and a transparent plastic film of an interpolymer of tetrafluoroethylene and hexafluoropropylene having a thickness between about 1 mil and about 2 mils between said cover glass and said antireflective coating, said copolymer being bonded to said cover glass and said antireflective coating to bind said cover glass to said wafer, said copolymer being substantially unaffected by ultraviolet radiation thereby eliminating the need for ultraviolet filters.

2. A covered solar cell as claimed in claim 1 including an antireflective coating on the cover glass.

3. In a method of making a covered solar cell for use in space wherein a transparent cover glass is attached to a wafer of silicon semiconductor material to dissipate heat and minimize bombardment damage, the improvement comprising the steps of placing a transparent plastic film of an interpolymer of tetrafluoroethyelene and hexaflurorpropylene between said wafer of silicon semiconductor material and said transparent cover glass, heating said assembled wafer, interpolymer of tetrafluoroethylene and hexafluoropropylene film, and transparent glass cover to a temperature of about 550° F, and applying a pressure of about 15 psi at said temperature to said assembly to bond said transparent cover glass to said wafer.

4. A method of making a covered solar cell as claimed in claim 3 including the step of first bonding the interpolymer of tetrafluoroethylene and hexafluoropropylene film to said transparent cover glass.

5. A method of making a covered solar cell as claimed in claim 3 including the step of first bonding the interpolymer of tetrafluoroethylene and hexafluoroethylene film to said wafer.

* * * * *